United States Patent [19]
McBean, Sr.

[11] Patent Number: 6,001,661
[45] Date of Patent: Dec. 14, 1999

[54] INTEGRATED CIRCUIT INTERCONNECT METHOD AND APPARATUS

[75] Inventor: Ronald V. McBean, Sr., Gilbert, Ariz.

[73] Assignee: Motorola, Inc., Schaumburg, Ill.

[21] Appl. No.: 09/055,206

[22] Filed: Apr. 6, 1998

[51] Int. Cl.[6] .......................... H01L 21/44; H01L 21/48; H01L 21/50

[52] U.S. Cl. .............................. 438/6; 438/107; 438/128

[58] Field of Search .................................. 438/106, 107, 438/128

[56] References Cited

U.S. PATENT DOCUMENTS

| | | | |
|---|---|---|---|
| 4,709,468 | 12/1987 | Wilson | 438/106 |
| 5,148,265 | 9/1992 | Khandros et al. | |
| 5,561,077 | 10/1996 | Terashima | 438/455 |
| 5,656,549 | 8/1997 | Woosley et al. | 438/118 |

*Primary Examiner*—Kevin M. Picardat
*Assistant Examiner*—Devon Collins
*Attorney, Agent, or Firm*—Robert D. Atkins

[57] ABSTRACT

A method of packaging a semiconductor device (10) partitions a distribution substrate (20, 40) into regions (31–34) such that attachment points (22) for electrically coupling to the semiconductor device lie in a first region (31). A first set of conductors are routed from a portion of the attachment points to terminals in a second region (32). Another portion of the attachment points are assigned to available routing channels of the second region for disposing a second set of conductors across the second region to a third region (33). Partitioning improves routing efficiency without requiring objects to be located on grid points or restricting the angles of the routing channels.

16 Claims, 3 Drawing Sheets

INTEGRATED CIRCUIT INTERCONNECT METHOD AND APPARATUS

BACKGROUND OF THE INVENTION

The present invention relates in general to semiconductors and, more particularly, to a semiconductor packaging method.

Chip scale integrated circuits are small footprint devices in which a semiconductor die is mounted on a distribution substrate whose dimensions are approximately the same as the dimensions of the semiconductor die. The distribution substrate includes a set of attachment points for coupling to bonding pads of the semiconductor die, and a set of terminals for making external connections. Pads are coupled to the terminals using conductors routed along a surface of the distribution substrate.

In many cases, more than one hundred conductors are needed to interconnect the bonding pads and terminals. Routing these conductors with prior art methods is both time consuming and inefficient. For example, one prior art technique uses manual trial and error methods to route the conductors from the attachment points to the terminals, which can require several days to complete. Another prior art method uses an automatic routing program, which uses several hours of computer time to interconnect the distribution substrate. However, the prior art automatic routers constrain the attachment points to being placed on exact grid points or else limit the conductors to orthogonal angles. Such limitations increase the size of the integrated circuit packages along with the manufacturing cost.

Hence, there is a need for a more efficient method of interconnecting a distribution substrate which results in a smaller package and lower manufacturing cost.

DETAILED DESCRIPTION OF THE DRAWINGS

In FIGS. 1–6, elements with the same reference number perform similar functions.

Figure 1:
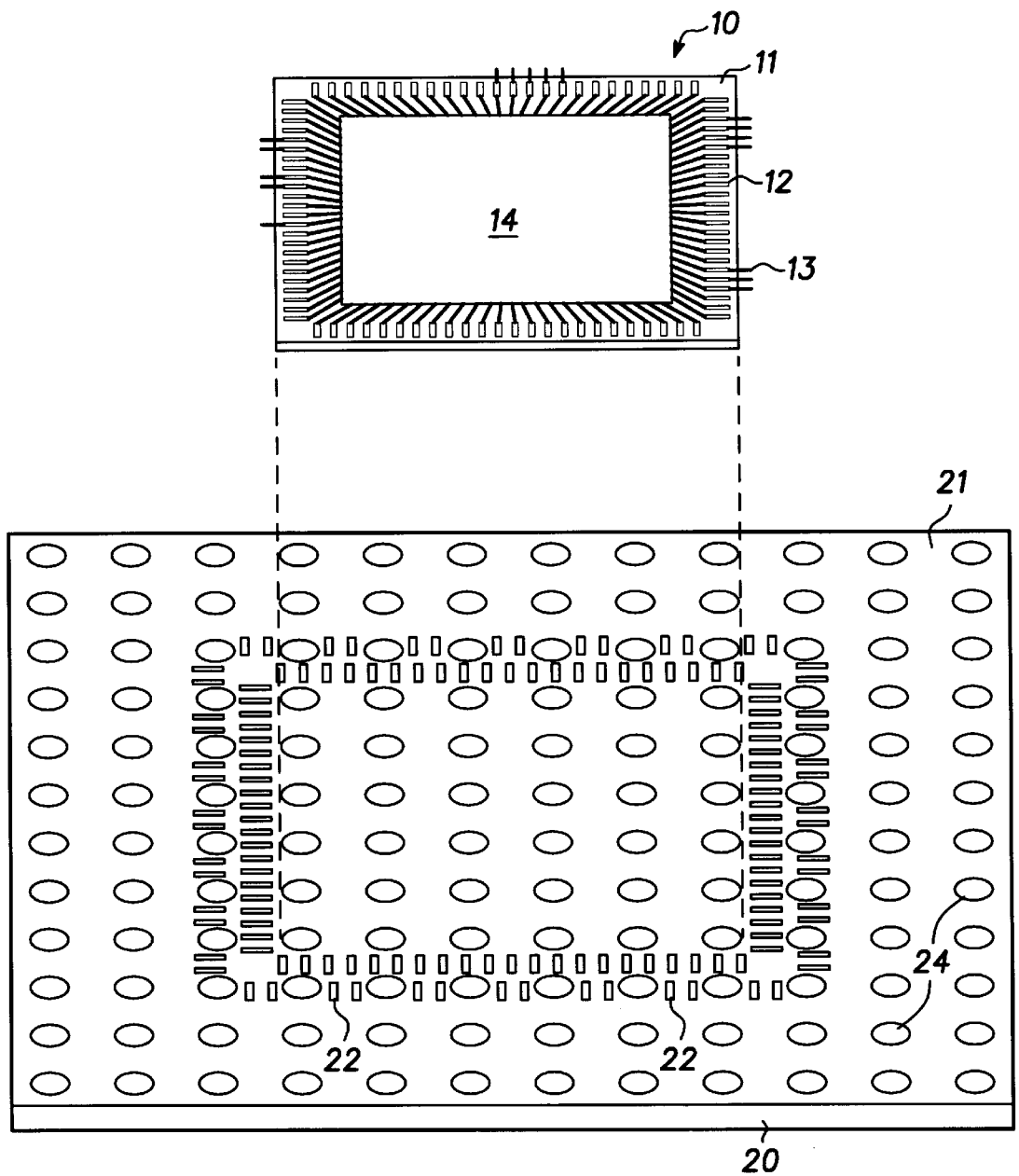
FIG. 1 illustrates an exploded isometric view of a semiconductor die and a distribution substrate in accordance with the present invention.

FIG. 1 illustrates an exploded isometric view of a semiconductor die 10 for mounting on a distribution substrate 20 to produce a packaged integrated circuit. Semiconductor die 10 has a surface 11 on which are formed a plurality of bonding pads 12 coupled to electrical circuitry formed in a region 14 of semiconductor die 10. Distribution substrate 20 comprises a printed wiring board that distributes the connections from a set of attachment points 22 to a set of terminals 24. The routing system described herein provides an efficient method of arranging conductors (not shown) on distribution substrate 20 to couple large numbers of attachment points 22 to a similar number of terminals 24.

A routing program is used to route conductors on a surface 21 of distribution substrate 20. Input data to the program consists of coordinate locations and other properties of attachment points 22 and terminals 24. The input data is stored in a database that represents the configuration of distribution substrate 20. The locations of attachment points 22 are referenced to an origin such as a corner of distribution substrate 20 and determined in accordance with requirements of the manufacturing process. In particular, the locations of attachment points 22 are set to provide reliable wire bonding to bonding pads 12. The locations of terminals 24 are set to conform to a standard integrated circuit packaging configuration such as the JEDEC standard, or are specified by a system manufacturer to fit a custom system circuit board.

An object library contains data representing objects such as vias, via terminals, and conductors for disposing on distribution substrate 20 to connect attachment points 22 to terminals 24. These objects have specific properties that determine where they can be placed to ensure that distribution substrate 20 is manufacturable. Values of these properties are specified in a set of design rules descriptive of the capabilities of the manufacturing process. Where more than one manufacturing process is available, each process has a unique set of design rules which can be selected by the designer before running the routing program. For example, where two different processes allow conductors to be formed with different pitches, property values defining the pitches are included in their respective design rules. The process allowing a less dense pitch may use less costly steps but produce a larger integrated circuit package, while the denser process can have a higher cost but produce a smaller package. If the routing program determines that distribution substrate 20 cannot be routed using one set of rules, the designer is so advised and can then select a different set of rules and rerun the program. Re-running the program also allows the designer to evaluate tradeoffs among package size, reliability, and manufacturing cost of each process.

A summary of object types and representative properties is shown in Table 1. It is understood that other properties may be specified in accordance with a particular embodiment without departing from the principles of the present invention. The properties of each object type are further explained hereinafter.

TABLE 1

| Object Type | Properties |
| --- | --- |
| Attachment Points | Location, Extent, Spacing, Node Name, Source |
| Via Terminals | Location, Extent, Spacing, Endpoint |
| Terminals | Location, Extent, Spacing, Endpoint |
| Vias | Location, Extent, Spacing, Assigned Node Name |
| Routing Channels | Location, Extent, Spacing, Assigned Node Name |

The routing program achieves a high degree of efficiency by partitioning distribution substrate 20 into regions, each of which contains objects of one type whose locations fall within the regions. Hence, attachment points 22 are included in one or more such regions while terminals 24 are included in other regions. Partitioning allows direct connection between objects in adjacent regions, and makes it easier to identify routing channels that traverse a region's boundaries for routing to more remote regions. Geometries of the regions can be manually specified by a designer by selecting appropriate region widths to sort objects into separate regions based on the arrangement of attachment points 22 and terminals 24. Alternatively, the designer can elect automatic partitioning, where region widths are equal to the pitch of the most densely packed objects, which typically are attachment points 22.

After partitioning, routing obstacles such as attachment points 22 or terminals 24 are identified within each partition. The distances between such obstacles are calculated to define where to place available routing channels to form conductors and vias. Partitioning allows the routing program to avoid searching the entire database for routing obstacles. Instead, it is only necessary to search for obstacles in the current region and adjacent or overlapping regions, rather than the entire database. Hence, a high degree of efficiency is achieved.

Routing commences in a region containing attachment points 22, which is initially designated as the current region, and progresses to adjacent regions in order. For example, attachment points 22 are densely spaced on a surface 21 of distribution substrate 20 in order to provide connectivity to bonding pads 12 of semiconductor die 10. To facilitate wire bonding, attachment points 22 are arranged in two rows along each side of distribution substrate 20. The routing of attachment points 22 in the outer row progresses outwardly to the outer regions of terminals 24, while the routing of attachment points 22 progresses inwardly to the inner regions of terminals 24.

Conductors are first routed from a portion of the attachment points to all of the terminals in the adjacent region. A conductor is formed by assigning an available routing channel to one of the attachment points 22 by setting the value of its assigned node name property to the name of the attachment point. Once a conductor is routed to a terminal or a via terminal, further routing of that conductor ends, as specified by the endpoint property of terminals and via terminals.

When the adjacent region has been routed, additional conductors are formed from a second portion of attachment points 22 and along routing channels that cross the adjacent region to more remote regions. When segments of the routing channels that lie within the adjacent region have been assigned to attachment points, the adjacent region becomes the designated current region to repeat the routing cycle progressively into successive regions. Routing channels are defined to always traverse their regions, so a conductor passing through one region can be extended into an adjacent region as long as it can be linked to an available routing channel in the adjacent region. Once conductors have connected all of the attachment points 22 to terminals 24, a subroutine converts the extent and location values of objects to geometric shapes to form the conductors and other objects on distribution substrate 20.

In the embodiment of FIG. 1, electrical connections between bonding pads 12 and attachment points 22 are made using wire bonds 13. However, alternative configurations are known and can be used. For example, semiconductor die 10 can be mounted in a flip chip arrangement where surface 11 faces surface 21 and bonding pads 12 are attached directly to corresponding attachment points 22 of distribution substrate 20 with reflowed solder.

External connections to the system circuit board (not shown) are made using terminals 24, which have more relaxed surface dimensions than attachment points 22 in order to simplify the manufacture of the system circuit board at a low cost and high level of reliability. For example, in the embodiment of FIG. 1, attachment points 22 have dimensions of 335.0 microns by 160.0 microns with a pitch of 356.0 microns, whereas terminals 24 are 350.0 microns in diameter with a pitch of 800.0 microns.

Figure 2:
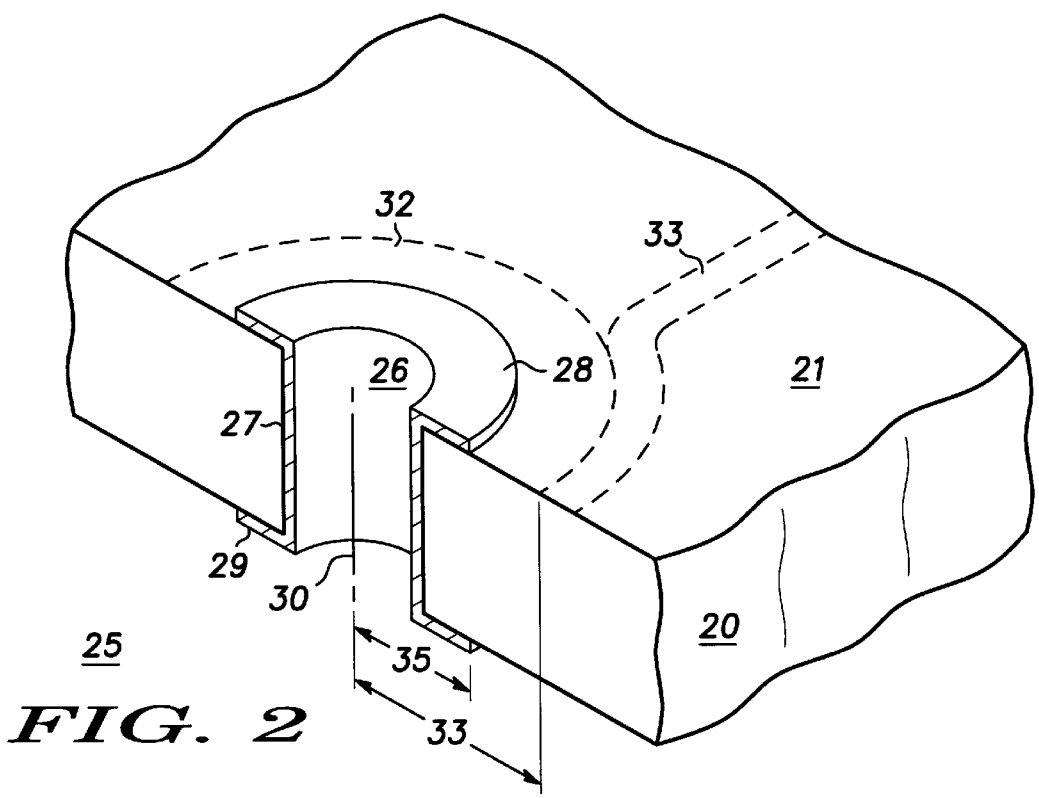
FIG. 2 illustrates a cutaway isometric view of a via terminal disposed in a distribution substrate in accordance with the present invention.

FIG. 2 illustrates a cutaway isometric view of a via terminal 25 disposed in distribution substrate 20 for electrically connecting a conductor on surface 21 to a contact point on the opposite surface of distribution substrate 20. Via terminal 25 includes an opening 26 formed in distribution substrate 20 and plated with a conductive layer 27 of a material such as solder, and first and second contact regions 28 and 29 respectively formed on surface 21 and the opposite surface as shown. Vias have similar structures as via terminals except that vias connect conductors on two surfaces, whereas via terminals are coupled to a conductor on only one surface as shown, with a solder ball typically formed on the contact point of the other surface for connection to the system board.

Via terminal 25 has the location property whose value is the coordinate of its geometric center 30. Its extent property has the value equal to the radius 35 of contact regions 28 and 29. The spacing property is shown graphically as a "keepout" region 32 that is concentric with contact regions 28 and 29 and defines the minimum distance to other nearby objects. For example, routing channel 33 is restricted from traversing keepout region 32 to electrically isolate a conductor routed along routing channel 33 from contact region 28, as shown in the figure. Hence, via terminal 25 acts as an obstacle to prevent routing channels from intersecting keepout region 32. The spacing property is stored in the database as a radius 33 of region 32.

Routing channel 33 has a location property stored as the coordinate of a point such as its midpoint. The assigned node name property links routing channel 33 to a particular attachment point to form a conductor. Other geometric properties, such as the extent and spacing properties, are determined when distribution substrate 20 is partitioned, and therefore are not separately stored.

Vias have similar properties as via terminal 25, but do not function as endpoints, and so do not have the endpoint property. Most manufacturing processes have different limits to the placement of via terminals which do not apply to vias, and vice versa. Therefore, the property values of vias and via terminals often are different. Typically, the extent and spacing of via terminals is larger than the same properties of vias.

Figure 3:
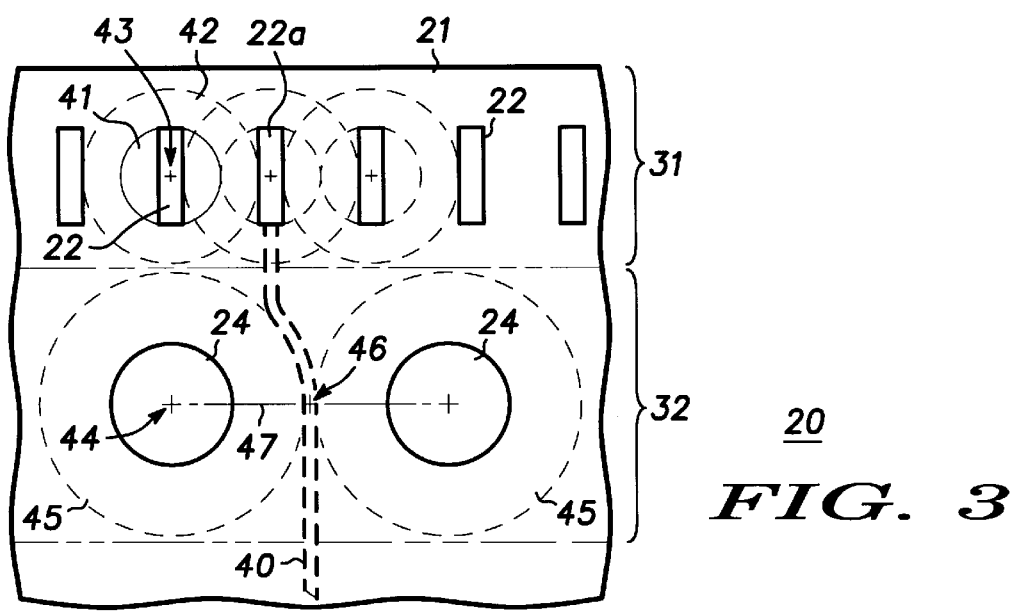
FIG. 3 illustrates a top view of a portion of a distribution substrate in accordance with the present invention.

FIG. 3 illustrates a portion of surface 21 of distribution substrate 20, including attachment points 22, terminals 24 and a routing channel 40. Distribution substrate 20 is partitioned into regions 31 and 32 as will be described. Region 31 includes attachment points 22 and region 32 includes terminals 24 as shown.

Attachment points 22 have location properties stored as the coordinates of their geometric centers. The extent property of each attachment point 22 is defined as a circular region 41 formed by rotating about a geometric center 43. Attachment points 22 are typically the most densely packed objects, and are located such that adjacent regions 41 can overlap each other without violating design rules, as shown in the figure. The spacing property is illustrated by a circular keepout region 42 concentric with region 41. Attachment points 22 are allowed to occupy spaces within the keepout region 42 of other attachment points 22, while other types of objects cannot do so. For example, where keepout regions 42 overlap as shown in FIG. 3, a routing channel or conductor cannot be formed between adjacent attachment points 22. Routing begins at attachment points 22, which therefore have the source property as well as a node name.

Terminals 24 have location properties defined by the coordinate of their geometric centers 44, and extent properties stored as the radius of terminal 24. A concentric keepout region 45 is stored as its radius.

Routing channel 40 has a segment located in region 32 and another segment in region 31. The segments are linked by assigning the same node name to each segment. The segment within region 32 is stored as its midpoint 46 lying along the axis 47 between adjacent terminals 24. Axis 47 lies along the most congested portion of region 32, so if sufficient space exists along axis 47 for routing channel 40 to fit between keepout regions 45, a conductor formed along routing channel 40 can always cross region 32. Note that where an obstacle such as an attachment point prevents routing channel 40 from extending across region 32 as a straight line segment, the design rules allow routing channel 40 to bend as shown to form a continuous path from attachment point 22a across region 32. Hence, the routing program identifies the most congested portion of a region to locate routing channels that can cross the region.

Figure 4:
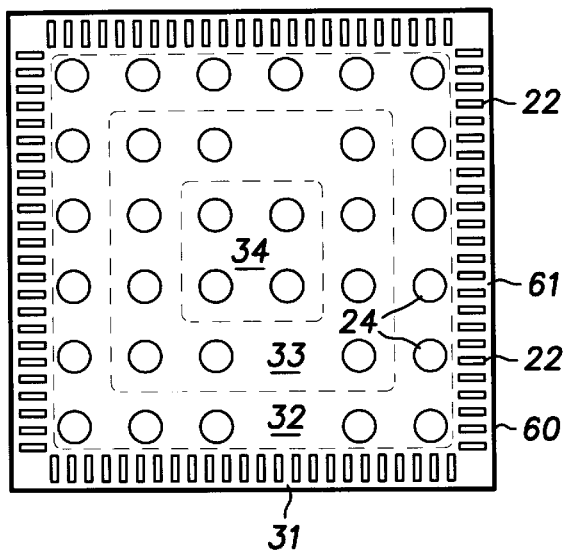
FIG. 4 illustrates a top view of a surface of a distribution substrate in accordance with the present invention.

FIG. 4 illustrates a surface 61 of another example of a distribution substrate 60, which is used to explain the routing method. Distribution substrate 60 is similar to distribution substrate 20, but includes fewer attachment points 22 and terminals 24 to simplify the description.

Distribution substrate 60 is partitioned into regions 31–34, which are shown as concentric rectangular rings to take advantage of the symmetrical arrangement of objects on surface 21. Routing progresses inwardly from region 31 to region 34 as will be described herein. Where surface 61 is configured to be symmetrical in two axes, regions 31–34 can be further partitioned into quadrants to reduce the amount of data to be searched at each routing step. Region 31 includes attachment points 22, while regions 32–34 include first, second and third sets of terminals 24, respectively. In another application, region 34 can be reserved for the placement of vias for interconnecting between layers.

The routing system treats vias in a similar fashion to routing channels. That is, once obstacles have been identified, possible via locations are computed in a fashion similar to available routing channels by fitting the design rules to the calculated distances between objects. Note that the possible via locations and available routing channels are merely potential conductors until they have been assigned node names. Hence, possible via locations will often be defined in the same locations as available routing channels. However, once a routing channel is assigned a node name a conductor is formed, and the location of that routing channel is no longer available as a possible location for forming a via, and vice versa.

Partitioning can produce regions whose widths are less than the spacing between objects within those regions, so partitioned regions can be generated which have no included objects. For example, assume that the extent of attachment points 22 is one thousand micrometers, so that partitions 31–34 have widths of one thousand micrometers. If terminals 24 have spacings of two thousand micrometers, partitions can be generated between adjacent terminals 24 which contain no objects.

Such empty partitions are nevertheless useful for computing the locations of obstacles and available routing channels because objects can have an influence beyond the boundaries of their regions. For example, a terminal can have a location within one region while its spacing overlaps into an adjacent region. To keep track of properties that extend beyond a boundary of an object's region, empty partitions are retained in order to ensure that all of the obstacles are accounted for. However, in order to simplify the description, such empty partitions are not shown in FIG. 4.

Figure 5:
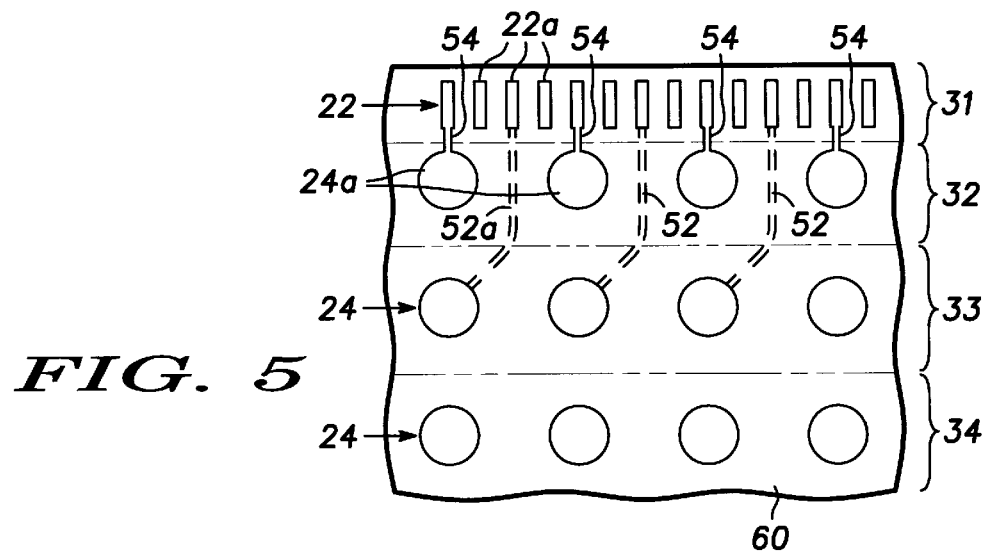
FIG. 5 illustrates a portion of distribution substrate showing partitioned regions in accordance with the present invention.

FIG. 5 illustrates a portion of distribution substrate 40 including partitioned regions 31–34 containing attachment points 22 and terminals 24.

Routing commences at attachment points 22 of region 31. Routing channels 54 are assigned to attachment points 22 to form conductors that couple to terminals 24a in region 32. When terminals 24a of region 32 have been connected, the next routing step is performed by assigning other routing channels in region 32 to a second portion of attachment points 22 in order to interconnect across region 32 to terminals 24 of region 33. Once the second portion of attachment points 22 have been routed to all of the terminals 24, and the routing channels of region 32 have been assigned to the remaining attachment points 22, region 32 is designated as the current region for extending its routing channels into region 33. Hence, the routing program repeats the cycle by extending routing channels of region 32 to terminals 24 and routing channels of region 33. The extensions are performed by assigning the terminals 24 and routing channels of region 33 to a third portion of attachment points 22.

An advantage of the partitioning method described herein is that the unrouted attachment points 22 and the unassigned routing channels of region 32 can be counted and compared to quickly determine whether a set of design rules allow distribution substrate 60 to be routed. If the number of unrouted attachment points 22 exceeds the number of available routing channels, distribution substrate 60 is not routable using the current set of design rules. For example, the design rules used in the example of FIG. 5 allow one routing channel 52a to be placed between adjacent terminals 24a, whereas three attachment points 22a need to be routed between terminals 24a. Hence, the number of unrouted attachment points 22a exceeds the number of available unassigned routing channels 52a, and the configuration is not routable.

Figure 6:
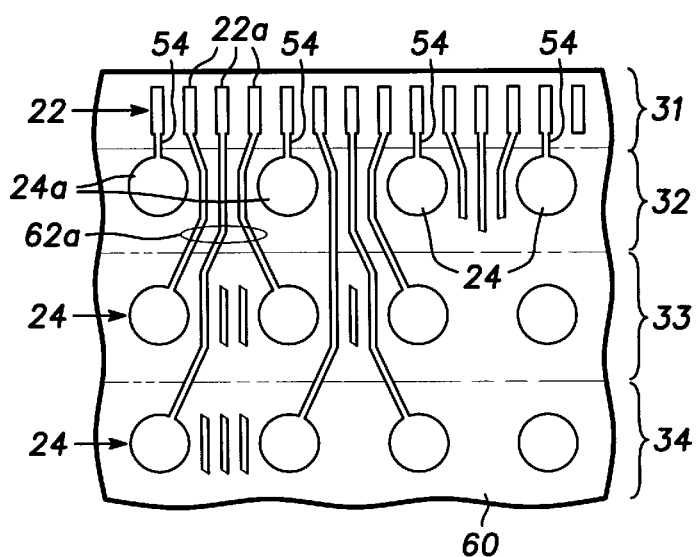
FIG. 6 illustrates a portion of a distribution substrate configured with an alternate set of design rules in accordance with the present invention.

FIG. 6 illustrates a portion of distribution substrate 60 whose configuration has been adjusted to incorporate a second, and more aggressive, set of design rules which allow three routing channels 62a to be located in the space between adjacent terminals 24a. This adjustment is typically made after determining that the first set of design rules, which allow only a single channel between terminals 24, is unroutable. The increased number of routing channels 62a now exceed, i.e., are equal to, the number of unrouted attachment points 22a. Therefore conductors can be formed along routing channels 62a to cross region 32 as shown.

Hence, partitioning allows a designer to quickly determine whether a given set of design rules is adequate to render a distribution substrate routable. The tradeoff between routability and manufacturing cost can be evaluated after only a few minutes of computer time, much faster than prior art methods.

When all of the attachment points have been routed to terminals 24 and routing channels 62 and 62a of region 32, region 32 is designated as the current region. The routing program repeat the cycle by first routing to all of the terminals 24 of region 33, with a remainder portion of attachment points 22 being routed on conductors formed by linking routing channels that traverse regions 32 and 33 for connecting to terminals in region 34. When all of the attachment points 22 have been routed to terminals, the resulting data is sent to a subroutine which generates geometric shapes that form conductors with corresponding shapes on distribution substrate 60 for packaging a semiconductor die to make the integrated circuit.

By now it should be appreciated that the present invention provides a method of packaging a semiconductor device that is more efficient and reduces the cost of interconnecting bonding pads of a semiconductor die with terminals of the package. A distribution substrate is partitioned into regions such that attachment points for electrically coupling to the semiconductor device lie in a first region. A first set of conductors are routed from a portion of the attachment points to terminals in a second region. Another portion of the attachment points are assigned to available routing channels of the second region for disposing a second set of conductors across the second region to a third region. Partitioning eliminates the need to search the entire database for routing obstacles because only partitions that are adjacent to or overlap the current partition have objects which function as obstacles. Hence, the present invention reduces the amount of data that needs to be searched in order to locate an available routing channel. As a result, routing efficiency is improved without the need to limit the placement of objects to grid points or to restrict the routing channels to orthogonal angles.

What is claimed is:

1. A computer implemented method for packaging a semiconductor device, comprising the steps of:

partitioning a distribution substrate into regions, where a first region includes attachment points for electrically coupling to the semiconductor device;

routing a first set of conductors from a first portion of the attachment points to terminals of a second region;

establishing a routable area between first and second terminals of the second region at least a predetermined distance from the first terminal of the second region and at least a predetermined distance from the second terminal of the second region; and assigning a second portion of the attachment points to available channels within the routable area of the second region to route a second set of conductors from the second portion of the attachment points across the second region to terminals of a third region.

2. The method of claim 1, further comprising the step of computing available channels of the second region with a first set of design rules of the distribution substrate.

3. The method of claim 2, wherein the step of computing includes the steps of:

measuring distances between adjacent terminals of the second region to produce a set of terminal spacings; and identifying the available channels of the second region with the set of terminal spacings and the first set of design rules.

4. The method of claim 3, further comprising the step of routing a second set of conductors along the available channels of the second region to terminals of the third region.

5. The method of claim 4, further comprising the steps of:

assigning a first attachment point to a first available channel of the second region and a second available channel of the third region for coupling the first attachment point across the second and third regions to a fourth region of the distribution substrate; and routing a conductor from the first attachment point along the first and second available channels to a terminal of the fourth region.

6. The method of claim 4, wherein the step of routing the second set of conductors includes the steps of:

counting the available channels of the second region to produce a first count;

counting unassigned attachment points to produce a second count; and comparing the first count to the second count to determine whether a number of the unassigned attachment points exceeds a number of the available channels of the second region.

7. The method of claim 6, wherein the second count exceeds the first count, further comprising the steps of:

providing a second set of design rules of the distribution substrate; and identifying the available channels of the second region with the set of terminal spacings and the second set of design rules to increase the first count.

8. The method of claim 7, further comprising the step of reducing a pitch of the available channels of the second region with the second set of design rules.

9. The method of claim 7, wherein the second set of conductors is routed on a first interconnect layer, further comprising the steps of:

defining an available channel of a second interconnect layer with the second set of design rules; and routing a third conductor across the second region on the second interconnect layer.

10. The method of claim 9, further comprising the step of disposing a via in an available channel of the second region for coupling one of the second set of conductors to the third conductor.

11. A computer implemented method of packaging a semiconductor die, comprising the steps of:

partitioning a distribution substrate into regions, where attachment points within a first region are disposed for coupling to bonding pads of the semiconductor die;

routing a first conductor from a first portion of the attachment points to a terminal disposed within a second region of the distribution substrate;

determining whether a number of available routing channels of the second region exceeds a remainder portion of the attachment points; and forming the first conductor on the distribution substrate in a routable area between first and second terminals of the second region at least a predetermined distance from the first terminal of the second region and at least a predetermined distance from the second terminal of the second region if the number of available routing channels of the second region does not exceed the remainder portion of the attachment points.

12. The method of claim 9, wherein the step of determining includes the steps of:

counting the available routing channels of the second region to produce a first count;

counting the remainder portion of the attachment points to produce a second count; and comparing the first count to the second count.

13. The method of claim 12, wherein the first count exceeds the second count, further comprising the step of assigning the available routing channels of the second region to the remainder portion of the attachment points.

14. The method of claim 13, further comprising the step of routing a second conductor along the available routing channels of the second region.

15. The method of claim 14, wherein the step of routing the second conductor includes the step of routing the second conductor across the second region for coupling to a terminal disposed within a third region.

16. A semiconductor device, comprising:
- a semiconductor die having a plurality of contact points; and
- a substrate having attachment points for electrically coupling to the contact points on the semiconductor die, the substrate including,
  - (a) a first terminal having a keepout region extending from the first terminal for a predetermined distance where no conductor is disposed within the keepout region,
  - (b) a first conductor coupled between a first attachment point and the first terminal on the substrate, and
  - (c) a second conductor coupled between a second attachment point and a second terminal of the substrate, disposed a greater distance from the attachment points than the first terminal, along a route excluding the keepout region of the first terminal, wherein the second attachment point is placed a distance from the first attachment point which is less than a distance from a midpoint of the first terminal to an exterior edge of the keepout region.

* * * * *